(12) United States Patent
Kawano et al.

(10) Patent No.: US 7,947,955 B2
(45) Date of Patent: May 24, 2011

(54) APPARATUS AND METHOD FOR DETECTING TERAHERTZ WAVE

(75) Inventors: Yukio Kawano, Saitama (JP); Koji Ishibashi, Saitama (JP)

(73) Assignee: Riken, Saitama (JP)

( * ) Notice: Subject to any disclaimer, the term of this patent is extended or adjusted under 35 U.S.C. 154(b) by 0 days.

(21) Appl. No.: 12/701,359

(22) Filed: Feb. 5, 2010

(65) Prior Publication Data

US 2010/0200755 A1    Aug. 12, 2010

(30) Foreign Application Priority Data

Feb. 9, 2009  (JP) .................................. 2009-027537

(51) Int. Cl.
*G01J 5/02*    (2006.01)
(52) U.S. Cl. ................................... 250/341.1
(58) Field of Classification Search .... 250/338.1–338.5, 250/339.01–339.15, 341.1–341.8
See application file for complete search history.

(56) References Cited

U.S. PATENT DOCUMENTS 6,627,914 B1 * 9/2003  Komiyama et al. ............. 257/29

FOREIGN PATENT DOCUMENTS

| JP | 2003-232730 A | 8/2003 |
| JP | 2008-205272 A | 9/2008 |

OTHER PUBLICATIONS

Lui et al., "Fabrication of grapnene p-n-p junctions with contactless top gates," 2008, Applied Physics Letters, vol. 92, pp. 203103-1-203103-3.*
Portnoi et al., "Terahertz emitters and detectors based on carbon nanotubes," 2006, Proceedings of SPIE, pp. 632805-1-632805-7.*
Kibis et al., "Carbon nanotubes as a basis for novel terahertz devices,", 2008, Physica E, vol. 40, pp. 1766-1768.*
Scalari et al., "A THz qunatum cascade detector in a strong perpendicular magnetic field," 2006, Semiconductor Science and Technology, vol. 21, pp. 1743-1746.*
T. Fuse et al., "Coulomb Peak Shifts Under Terahertz-Wave Irradiation In Carbon Nanotube Single-Electron Transistors," Applied Physics Letters 90, 013119 (2007).
C. Otani et al., "Direct and Indirect Detection of Terahertz Waves Using a Nb-Based Superconducting Tunnel Junction," Journal of Physics: Conference Series 43 (2006) pp. 1303-1306.
M.L. Sadowski et al., "Landau Level Spectroscopy of Ultrathin Graphite Layers," Physical Review Letters, PRL 97, 266405 (2006).
Z. Jiang et al., "Infrared Spectroscopy of Landau Levels of Graphene," Physical Review Letters, PRL 98, 197403 (2007).
S. Masubuchi et al., "Observation of Half-Integer Quantum Hall Effect in Single-Layer Graphene Using Pulse Magnet," Journal of the Physical Society of Japan, vol. 77, No. 11, Nov. 2008, 113707.

* cited by examiner

*Primary Examiner* — David P Porta
*Assistant Examiner* — Kiho Kim
(74) *Attorney, Agent, or Firm* — Griffin & Szipl, P.C.

(57) ABSTRACT

A terahertz wave detecting apparatus includes a semiconductor chip 12, a two-dimensional graphene 14, a conductive source electrode 15, and a drain electrode 16 and a gate electrode 17. The two-dimensional graphene 14 is connected to the source electrode and the drain electrode. The apparatus further includes a SD voltage detection circuit 18, a gate voltage applying circuit 19 and a magnetic field generating device 20.

5 Claims, 10 Drawing Sheets

Prior Art

APPARATUS AND METHOD FOR DETECTING TERAHERTZ WAVE

This application claims priority from Japanese Patent Application No. 2009-027537 filed Feb. 9, 2009, the entire disclosure of which is incorporated herein by reference.

BACKGROUND OF THE INVENTION

1. Field of the Invention

The present invention relates to an apparatus and a method for detecting the intensity and frequency of weak terahertz waves.

2. Description of the Related Art

In the present invention, the term "terahertz waves" means electromagnetic waves whose frequency is in the range of 1 to 50 THz (where, 1 THz=$10^{12}$ Hz), i.e., whose wavelength is in the range from a 0.006-0.3 mm, corresponding to or belonging to submillimeter-wave region to the far-infrared region. In the following description, the "terahertz waves" are referred to as "terahertz light."

The terahertz light is expected to be applied in a wide range of fields, ranging from basic science fields such as radio astronomy, materials science, and bimolecular spectroscopy to practical fields such as security, information communication, environment, and medical care.

However, since the terahertz light is electromagnetic waves the frequency band of which is interposed between light ($5\times10^{13}$ to $10^{15}$ Hz in frequency), such as near-infrared rays, visible light, and ultraviolet rays, and radio waves ($10^3$ to $10^{12}$ Hz in frequency), there is a problem that existing techniques, such as optics and electronics, cannot be applied as they are.

Various detectors for detecting terahertz light have been already proposed. Among them, Non-Patent Documents 1 and 2 disclose detectors capable of detecting very weak terahertz light having an intensity of a few fW ($10^{-15}$ W).

In addition, Patent Document 1 discloses a detector capable of detecting the frequency of terahertz light.

In the meantime, "graphene" is an atomic monolayer of two-dimensional carbon crystal, having carbon atoms in each chain arranged in a hexagonal or honeycomb shape. In recent years, the unique electronic properties of graphene have attracted attention as reported in Non-Patent Documents 3 and 4, and already proposed in Patent Document 2.

Non-Patent Document 1 describes detecting detect terahertz light by using carbon nanotubes on a silicon substrate on which a silicon oxide film is formed. Non-Patent Document 2 teaches a terahertz light detector using superconductivity. Non-Patent Document 3 teaches a related technique of the present invention.

Figure 1:
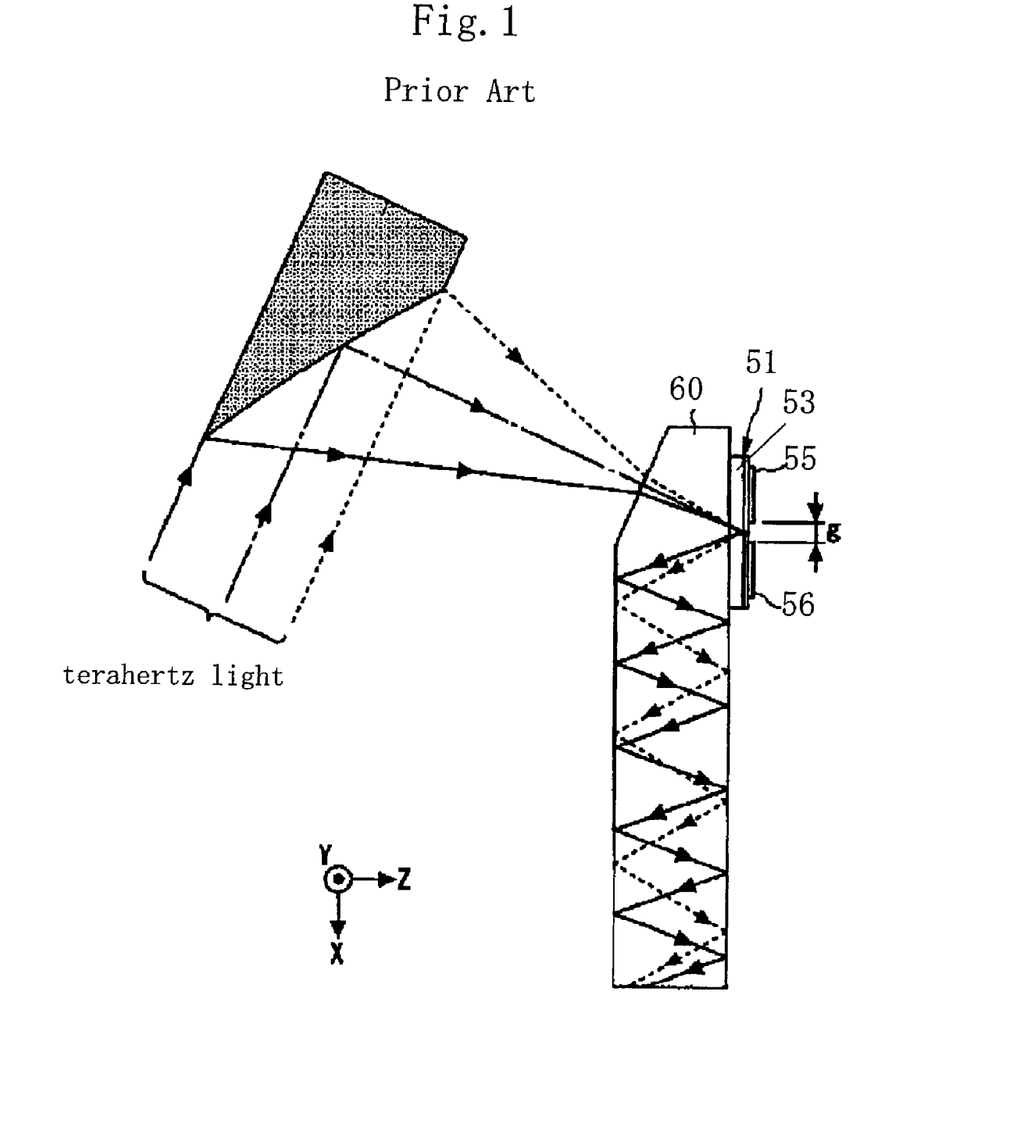
FIG. 1 is a diagram showing the structure of a detector disclosed in Patent Document 1.

Patent Document 1 aims to obtain spectra having good S/N ratios in high frequency resolution measurements. To this end, as shown in FIG. 1, a detector body 51 disclosed in Patent Document 1 has a substrate 53, and a detecting element section (i.e., a portion of gap g between metal layers 55 and 56) including an optical switch element formed on the +Z-side surface of the substrate 53. A member 60 having nearly the same refractive index as that of the substrate 53 is provided on the −Z-side of the substrate 53 so that no terahertz pulsed light reflecting surface will be formed between the −Z-side surface of the member 60 and the +Z-side surface of the substrate 53. The shape of the −Z-side surface of the member 60 and the thickness of the member 60 are so set that light reflected on the +Z-side surface of the substrate 52 among the terahertz light incident from a certain area of the −Z-side surface of the member 60 and converged in the vicinity of the area (effective area) of the gap g will not substantially enter the area of the gap g after being reflected on the −Z-side surface of the member 60 or will enter the area of the gap g only after being reflected on the −Z-side surface of the member 60 twice or more.

Figure 2:
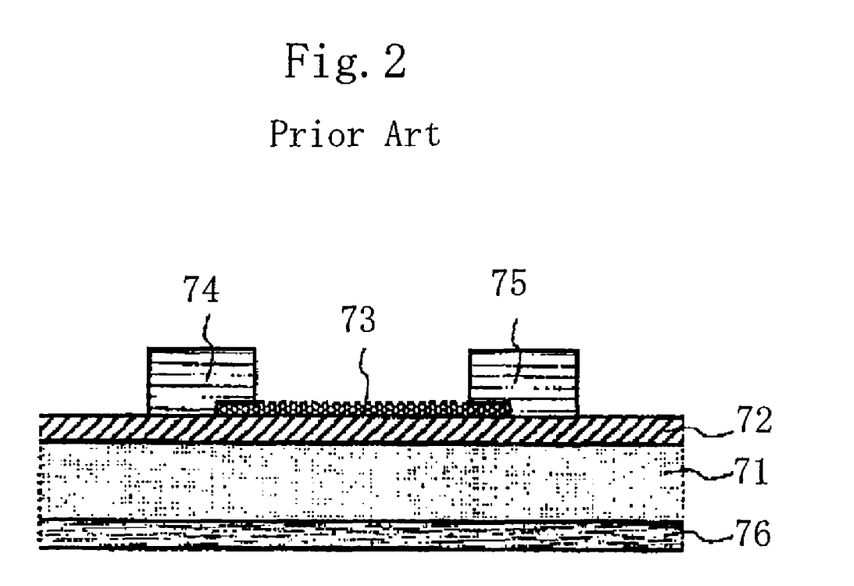
FIG. 2 is a sectional view showing the structure of a graphene transistor disclosed in Patent Document 2.

Patent Document 2 relates to a graphene transistor and a manufacturing method thereof, aiming to provide a transistor using a graphene formed by a growth method for normal stabilized carbon nanotubes. To this end, as shown in FIG. 2, the graphene transistor disclosed in Patent Document 2 is made up as follows: Graphene 73 formed at a front edge of carbon nanotubes in the growth process thereof is stuck on a substrate 71 through an insulator 72 having adhesive properties. The graphene 73 is provided to serve as a channel, where a source electrode 74 is formed at one end of the channel, and a drain electrode 75 is formed at the other end of the channel, while providing a gate electrode 76.

[Non-Patent Document 1]
T. Fuse, et al., "Coulomb peak shifts under terahertz-wave irradiation in carbon nanotube single-electron transistors," Applied Physics Letters 90, 013119 (2007).

[Non-Patent Document 2]
C. Otani, et al., "Direct and Indirect Detection of Terahertz Waves using a Nb-based Superconducting Tunnel Junction," Journal of Physics: Conference Series, vol. 43, pp. 1303-1306 (2006).

[Non-Patent Document 3]
M. L. Sadowski, et al., "Landau Level Spectroscopy of Ultrathin Graphite Layers," PHYSICAL REVIEW LETTERS, PRL 97, 266405 (2006).

[Non-Patent Document 4]
Z. Jiang, et al., "Infrared Spectroscopy of Landau Level of Graphene," PHYSICAL REVIEW LETTERS, PRL 98, 197403 (2007).

[Non-Patent Document 5]
S. Masubuchi, et al., "Observation of Half-Integer Qyantum Hall Effect in Single-Layer Graphene Using Pulse Magnet," Journal of the Physical Society of Japan, Vol. 77, No. 11, November 2008, 113707.

[Patent Document 1]
Japanese Patent Application Laid-Open No. 2003-232730 titled "TERAHERTZ LIGHT DETECTOR."

[Patent Document 2]
Japanese Patent Application Laid-Open No. 2008-205272 titled "GRAPHENE TRANSISTOR AND MANUFACTURING METHOD THEREOF."

The terahertz light detector disclosed in Non-Patent Document 1 uses terahertz response of electrons captured at an impurity level in a silicon dioxide film. Therefore, the carbon nanotubes cannot be placed in desired positions with respect to the impurities during manufacturing of the detector. Further, since sharp wavelength selectivity is not provided at the impurity level, the frequency of terahertz light cannot be measured.

The terahertz light detector disclosed in Non-Patent Document 2 requires ultralow temperatures of 0.3 to 0.4 K to obtain high sensitivity, and hence it requires use of an expensive, large-scale helium-3 cryostat.

In the terahertz light detector disclosed in Patent Document 1, since terahertz light is absorbed by the member 60, very weak terahertz light having an intensity of a few fW ($10^{-15}$ W) cannot be detected.

The conventional terahertz light detectors further have a problem that the frequency range of detectable terahertz light is narrow.

SUMMARY OF THE INVENTION

The present invention has been made to solve the above-mentioned problems. It is an object of the present invention to provide a terahertz wave detecting apparatus and its method, capable of clearly detecting the intensity of very weak terahertz light in a small-scale apparatus structure using unique electronic properties of graphene without the need for ultralow temperatures, and capable of accurately measuring the frequency of the terahertz light in a very wide frequency range.

According to the present invention, there is provided a terahertz wave detecting apparatus including:

a semiconductor chip with an oxidized layer formed on a surface thereof;

a two-dimensional graphene, a conductive source electrode, and a drain electrode, all provided to adhere tightly to the surface of the semiconductor chip; and a gate electrode provided to adhere tightly to the reverse side of the semiconductor chip, wherein the two-dimensional graphene extends along the surface of the semiconductor chip, and both ends thereof are connected to the source electrode and the drain electrode, respectively, and the apparatus further includes:

a SD voltage detection circuit for passing certain current between the source electrode and the drain electrode to detect a SD voltage therebetween;

a gate voltage applying circuit for applying a variable gate voltage to the gate electrode; and a magnetic field generating device for applying a variable magnetic field to the two-dimensional graphene.

According to a preferred embodiment of the present invention, a detection control device is provided to control the SD voltage detection circuit, the gate voltage applying circuit, and the magnetic field generating device, and calculate the frequency and intensity of terahertz light from the SD voltage, the gate voltage, and a value of the magnetic field.

The detection control device also measures the dependence of the SD voltage on the gate voltage and the magnetic field while irradiating terahertz light, detects a magnetic field value corresponding to the largest change in SD voltage with respect to the gate voltage and the magnetic field due to the irradiation of the terahertz light, and calculates the intensity and frequency of the terahertz light from this magnetic field value and the change in SD voltage.

According to the present invention, there is also provided a terahertz wave detecting method comprising:

preparing a terahertz wave detecting apparatus, including
a semiconductor chip with an oxidized layer formed on a surface thereof,
a two-dimensional graphene, a conductive source electrode, and a drain electrode, all provided to adhere tightly to the surface of the semiconductor chip, and
a gate electrode provided to adhere tightly to the reverse side of the semiconductor chip, wherein
the two-dimensional graphene extends along the surface of the semiconductor chip, and both ends thereof are connected to the source electrode and the drain electrode, respectively, and
the apparatus further includes
a SD voltage detection circuit for passing certain current between the source electrode and the drain electrode to detect a SD voltage therebetween,
a gate voltage applying circuit for applying a variable gate voltage to the gate electrode, and
a magnetic field generating device for applying a variable magnetic field to the two-dimensional graphene,
measuring the dependence of the SD voltage on the gate voltage and the magnetic field while irradiating terahertz light, detecting a magnetic field value corresponding to the largest change in SD voltage with respect to the gate voltage and the magnetic field due to the irradiation of the terahertz light, and calculating the frequency and intensity of the terahertz light from this magnetic field value and the change in SD voltage.

According to preferred embodiments of the present invention, the method is to:

fix a source-drain current at a constant value in a state not to irradiate the terahertz light, change the magnetic field while varying the gate voltage so that the relative position of Fermi energies in Landau levels will become constant, measure SD voltage V1, and calculate the dependence, V1=f1(B), of the SD voltage V1 on magnetic field B;

while irradiating a certain amount of terahertz light on condition that the source-drain current remains fixed, change the magnetic field while varying the gate voltage so that the relative position of the Fermi energies in the Landau levels will become constant; measure SD voltage V1', and calculate the dependence, V1'=f2(B), of the SD voltage V1' on the magnetic field B;

calculate a difference ΔV(B) between the SD voltage V1 and the SD voltage V1';

detect a peak in the difference ΔV(B), and determine the magnetic field B and the value of ΔV(B) at each peak;

detect the intensity of the terahertz light from the amount of change, ΔV(B), in SD voltage; and determine between which levels the occurrence of an electronic transition corresponds to the magnetic field B at the detected peak to calculate the frequency of the terahertz light therefrom.

According to the above structure of the present invention, photon energy hf of the terahertz light at the time of occurrence of cyclotron absorption equals Landau-level energy spacing at the time of occurrence of cyclotron absorption. Since this energy spacing in the graphene is more than one order of magnitude than those in normal semiconductor materials, the frequency of the terahertz light can be measured accurately in a very wide frequency range, e.g., between about 1 to 50 THz.

Further, since the ability of graphene electrons to conduct current is more than 10 to 100 times that of normal semiconductor materials such as silicon at room temperature, the intensity of very weak terahertz light can be detected clearly without the need for ultralow temperatures. In addition, the frequency can be measured accurately in a very wide frequency range.

To sum up, the present invention has the following advantages:

(1) Wide-band detection is possible because of the symmetry between electrons and holes to be described later and the formation of wide energy range of Landau levels also to be described later.

(2) Because the ability of electrons to conduct current is high, the need for ultralow temperatures is eliminated and very weak terahertz light can be detected.

DESCRIPTION OF THE PREFERRED EMBODIMENTS

Preferred embodiments of the present invention will now be described with reference to the accompanying drawings. In the drawings, common portions are given the same reference numerals to omit redundant description.

As mentioned above, "graphene" has a monolayer, hexagonal lattice structure like a honeycomb consisting of carbon atoms and their bonds, assuming the shape of a metal gauze.

In semiconductor materials such as silicon and other three-dimensional materials, charge carriers interact with periodic fields of the atomic lattice to form quasi-particles. On the other hand, quasi-particles in graphene have properties different from those in such three-dimensional material properties.

Figure 3A:
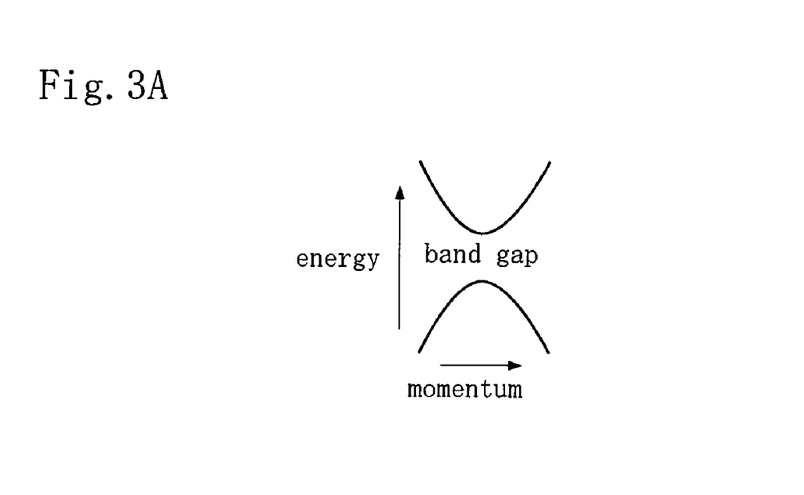
FIG. 3A and FIG. 3B are views for explaining energy bands.

As shown in FIG. 3A, the energy band of a typical three-dimensional semiconductor has a valence electron band having the shape of a lower parabola and a conduction band positioned above the valence electron band and having a shape obtained by flipping the parabola upside down, with an open band gap between the valence electron band and the conduction band.

Figure 3B:
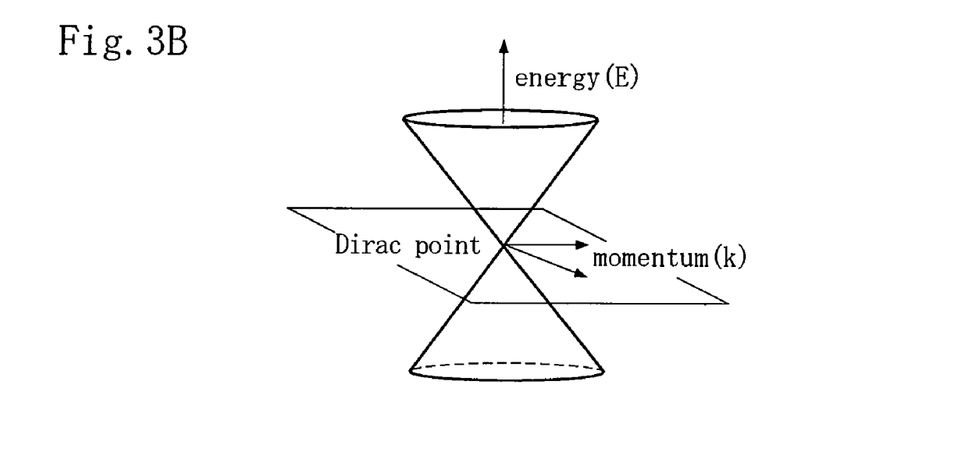

On the other hand, as shown in FIG. 3B, the energy bands of the graphene have two circular cones with both vertexes contacting each other. The contact point between the two circular cones is called Dirac point. Such energy bands are characterized by the energy and momentum of quasi-particles behaving like Dirac fermions as massless electrons. The quasi-particles move at a speed of about a few percent of the speed of light.

Because of this special band structure, electron mobility in the graphene is known to be very high even at room temperature (more than 10 to 100 times that of normal semiconductor materials).

Further, Fermi energy (chemical potential in a system of fermions at absolute zero) in a normal three-dimensional material such as semiconductor is proportional to the carrier density, while it is confirmed that Fermi energy in the graphene is proportional to the square root of the carrier density. In addition, since the valence electron band and the conduction band are symmetrical to each other about the Dirac point, a gate voltage is applied (to raise or lower the Fermi energy) so that carriers can be either electrons or holes (symmetry between electrons and holes).

Figure 4A:
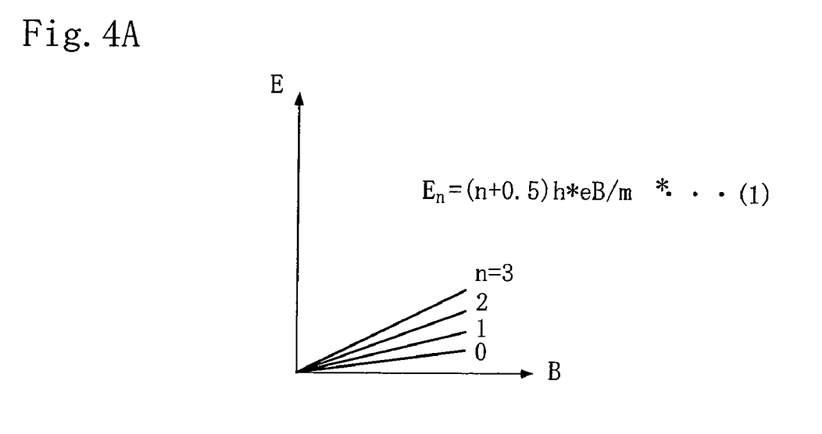
FIG. 4A and FIG. 4B are graphs showing relationships between magnetic field B and electronic energy E.
Figure 4B:
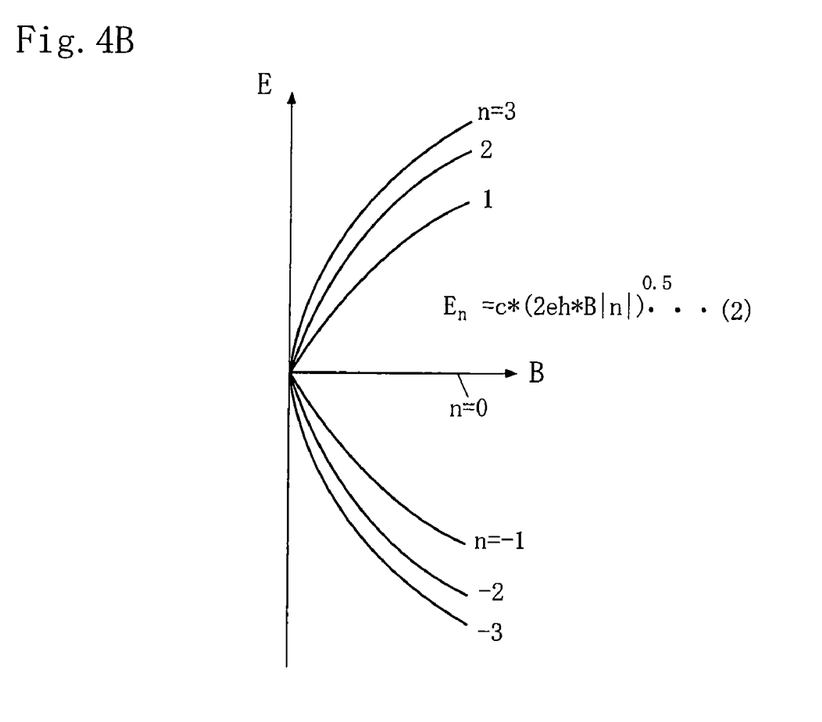

From the above-mentioned unique properties of the graphene, it is known that energy levels upon the application of a magnetic field exhibit relationships as shown in FIG. 4A and FIG. 4B, i.e., they are expressed by Equations (1) and (2). FIG. 4A shows a relationship between magnetic field B and electronic energy E in a normal semiconductor material, and FIG. 4B shows the B-E or E-B relationship in the graphene.

$$\text{Semiconductor: } E_n = (n+0.5)h^* eB/m^* \tag{1}$$

$$\text{Graphene: } E_n = c^*(2eh^*B|n|)^{0.5} \tag{2}$$

In Equations (1) and (2), $c^*$ is the speed of Dirac fermions, e is the elementary electric charge, $h^*$ is $1/(2\pi)$ of Planck's constant h, B is the applied magnetic field, n is the characteristic of Landau level, $m^*$ is the effective mass of electrons in the crystal (for example, in the case of GaAs, 0.0665 times of the free electron mass).

It is confirmed in Non-Patent Document 3 mentioned above that Equation (2) holds accurately in the range from 10 to 80 meV, and in Non-Patent Document 4 that Equation (2) holds accurately in the range from 100 to 500 meV.

Since $h^*$, e, and $m^*$ are constants, Equation (3) is derived from Equation (1). Here, C1 is a constant. Similarly, since $c^*$, e, and $h^*$ are constants, Equation (4) is derived from Equation (2). Here, C2 is a constant.

$$\text{Semiconductor: } E_n = C1(n+0.5)B \tag{3}$$

$$\text{Graphene: } E_n = C2(B|n|)^{0.5} \tag{4}$$

From Equation (3), the amount of change, $\Delta E$, of electronic energy E with respect to an increase in n (n=0, 1, 2, 3) is $C1 \times 0.5B$, which is proportional to the applied magnetic field B, and the interval of n=0, 1, 2, 3 is constant.

On the other hand, since it is found from Equation (4) that the amount of change, $\Delta E$, of electronic energy E with respect to an increase in n (n=−3, −2, −1, 0, 1, 2, 3) is proportional to $(B|n|)^{0.5}$, the interval of n=−3, −2, −1, 0, 1, 2, 3 is not constant.

The present invention has been made by focusing on this characteristic of graphene.

Figure 5:
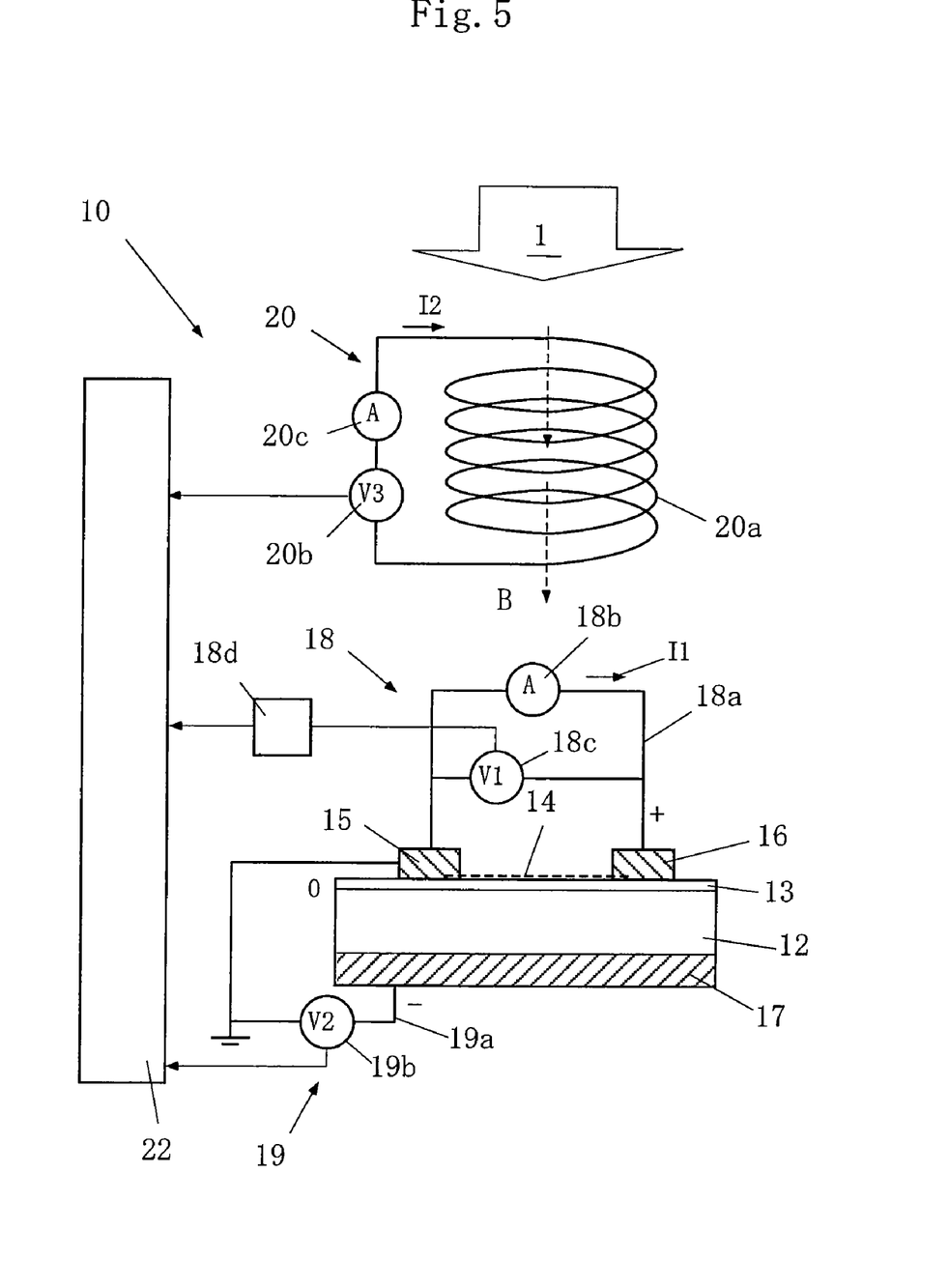
FIG. 5 is a diagram showing a first embodiment of a terahertz wave detecting apparatus according to the present invention.

FIG. 5 is a diagram showing the structure of a terahertz wave detecting apparatus according to the present invention. This figure schematically shows a sectional view of the terahertz wave detecting apparatus of the present invention.

As shown, the terahertz wave detecting apparatus 10 of the present invention includes a semiconductor chip 12, a two-dimensional graphene 14, a source electrode 15, a drain electrode 16, a gate electrode 17, a SD voltage detection circuit 18, a gate voltage applying circuit 19, and a magnetic field generating device 20.

The semiconductor chip 12 is a silicon film or GaAs film on which an oxidized layer 13 is formed.

The two-dimensional graphene 14 is a material made up of a single layer of a six-membered ring network (graphene sheet) made of carbon atoms. In this example, the two-dimensional graphene 14 is provided to adhere tightly to the surface of the semiconductor chip 12 (oxidized layer 13) and extends along the surface, and both ends thereof are connected to the source electrode 15 and the drain electrode 16.

The source electrode 15 and the drain electrode 16 are placed at some interval outside the two-dimensional graphene 14 with the two-dimensional graphene 14 put therebetween, and provided to adhere tightly to the surface of the semiconductor chip 12. Further, in this example, the source electrode 15 is grounded and held at 0V.

The source electrode 15 and the drain electrode 16 are thin films made of Au or Cr/Au, for example.

The gate electrode 17 are placed at a certain interval from the two-dimensional graphene 14, and provided to adhere tightly to the reverse side of the semiconductor chip 12. The gate electrode 17 is a thin film made of Au or Ti/Au, for example.

The SD voltage detection circuit 18 includes a conductive line 18a electrically connecting the source electrode 15 and the drain electrode 16, a DC power source 18b provided in the middle of the conductive line 18a, and a voltmeter 18c for measuring voltage V1 between the source electrode 15 and the drain electrode 16. The DC power source 18b passes certain current I1 between the source electrode 15 and the drain electrode 16 to turn the drain electrode 16 into a plus (+) state. The voltmeter 18c detects the voltage V1 (hereinafter called "source-drain voltage" or "SD voltage") between the source electrode 15 and the drain electrode 16.

A noise-cut filter 18d is removably attached to the voltmeter 18c to remove large noise voltage from an output signal of the voltmeter 18c.

The gate voltage applying circuit 19 includes a conductive line 19a electrically grounding the gate electrode 17, and a DC power source 19b provided in the middle of the conductive line 19a. The DC power source 19b applies variable gate voltage V2 to the gate electrode 17 to turn it into a minus (−) state. The voltage V2 applied to the gate electrode 17 is called "gate voltage" below.

The magnetic field generating device 20 includes a coil 20a surrounding the optical axis of terahertz light 1 incident on the semiconductor chip 12, a DC power source 20b for applying a certain voltage between both ends of the coil 20a, and an ammeter 20c indicating current I2 (hereinafter called "coil current") flowing through the coil 20a. The magnetic field generating device 20 applies a magnetic field B to the two-dimensional graphene 14 on the semiconductor chip 12. In actual measurements, a certain coil current I2 is passed through to detect voltage V3 applied to the coil.

The magnetic field B can be uniquely determined from the coil current I2.

When terahertz light 1 is irradiated onto the above-mentioned two-dimensional graphene 14, a phenomenon called photoconductivity is observed. The term "photoconductivity" means a phenomenon in which electric conductivity varies upon irradiation of light onto an insulator or semiconductor.

In normal semiconductor materials, this phenomenon occurs when electrons are excited due to light absorption from the valence electron band to the conduction band, or from the impurity level to the conduction band, to cause extra conductive electrons or holes. Here, the conduction of extra electrons or holes excited to Landau levels above and below the Fermi level brings changes in electric conductivity. Since they are within the magnetic field, a rise in electric conductivity turns into a rise in electric resistivity.

It is found from FIG. 4B and Equation (4) mentioned above that, when the photon energy hf of electromagnetic waves to be irradiated is equal to the Landau level energy spacing (for example, in the case n=1 to 2, $C2(B|2|)^{0.5} - C2(B|1|)^{0.5}$), the electromagnetic waves are absorbed in very large amounts. This phenomenon is called cyclotron absorption or cyclotron resonance.

The photon energy hf of terahertz light at the time of occurrence of cyclotron absorption equals Landau level energy spacing at the time of occurrence of cyclotron absorption.

In other words, for example, in the case of n=1 to 2, the following equation holds:

$$h^*f = (C2(B|2|))^{0.5} - (C2(B|1|))^{0.5} \qquad (5).$$

In this equation, since all in C2 (i.e., h*, e, m*) except the magnetic field B are known constants, the frequency f of terahertz light can be determined from the magnetic field B at the time of occurrence of cyclotron absorption.

In the terahertz wave detecting apparatus 10 of the present invention, the cyclotron absorption of the two-dimensional graphene 14 is used.

In FIG. 5, the terahertz wave detecting apparatus 10 of the present invention further includes a detection control device 22. The detection control device 22 is a computer (PC), for example, and has the functions of controlling the SD voltage detection circuit 18, the gate voltage applying circuit 19 and the magnetic field generating device 20, and calculating the frequency and intensity of the terahertz light 1 from the SD voltage V1, the gate voltage V2, and the magnetic field value B.

The detection control device 22 measures the dependence of the SD voltage V1 on the gate voltage and the magnetic field while irradiating the terahertz light 1, detects a magnetic field value corresponding to the largest change in SD voltage V1 with respect to the changes in the gate voltage and the magnetic field due to the irradiation of the terahertz light, and calculates the intensity and frequency of the terahertz light from this magnetic field value and the change in SD voltage.

Figure 6:
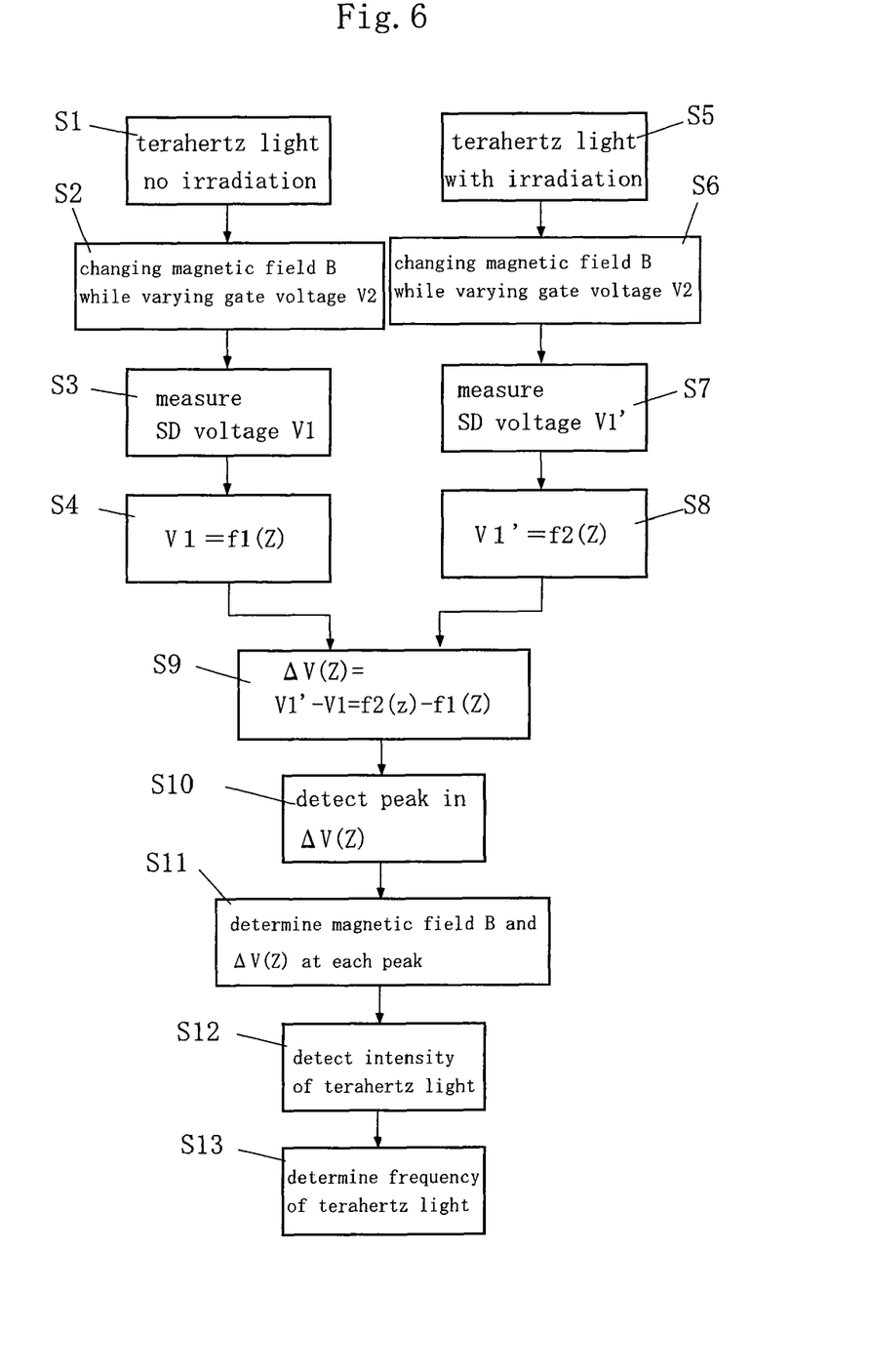
FIG. 6 is a flowchart showing a terahertz wave detecting method according to the present invention.

FIG. 6 is a flowchart showing a terahertz wave detecting method according to the present invention. In this figure, the terahertz wave detecting method of the present invention uses the above-mentioned terahertz wave detecting apparatus 10 of the present invention and includes steps S1 to S13.

(1) In steps S1 to S4, source-drain current I1 is fixed at a constant value in a state not to irradiate the terahertz light 1 (S1), the magnetic field B is changed while varying the gate voltage V2 so that the relative position of Fermi energies in Landau levels will become constant (S2), the SD voltage V1 is measured (S3), and the dependence, V1=f1(B), of the SD voltage V1 on the magnetic field B is calculated (S4).

(2) Similarly, in steps S5 to S8, in such a state that a certain amount of terahertz light 1 is irradiated (S5) on condition that the source-drain current I1 remains fixed, the magnetic field B is changed while varying the gate voltage V2 so that the relative position of the Fermi energies in the Landau levels will become constant (S6), SD voltage V1' is measured (S7), and the dependence, V1'=f2(B), of the SD voltage V1' on the magnetic field B is calculated (S8).

(3) In step S9, a difference, ΔV(B)=V1'−V1=f2(z)−f1(Z), between the SD voltage V1 and the SD voltage V1' is calculated. This difference is caused by the irradiation of the terahertz light 1.

(4) In step S10, a peak in ΔV(B) is detected, and in step S11, the magnetic field B and the value of ΔV(B) at each peak are determined.

(5) From the amount of change, ΔV(B), in SD voltage (i.e., difference between a value when terahertz light is present and a value when terahertz light is absent), the relative intensity of the terahertz light is determined. Further, the absolute intensity is determined from a comparison with a signal from a calibrated detector, thus detecting the intensity of the terahertz light (step S12).

(6) Based on Equation (2) shown in FIG. 4B and an equation for cyclotron resonance as hf(constant)=ΔE=Eb−Ea, where a and b any n in FIG. 4B), it is determined between which levels the occurrence of an electronic transition corresponds to the magnetic field B at the detected peak. From this determination, f (frequency of the terahertz light) is also determined (step S13).

Figure 7:
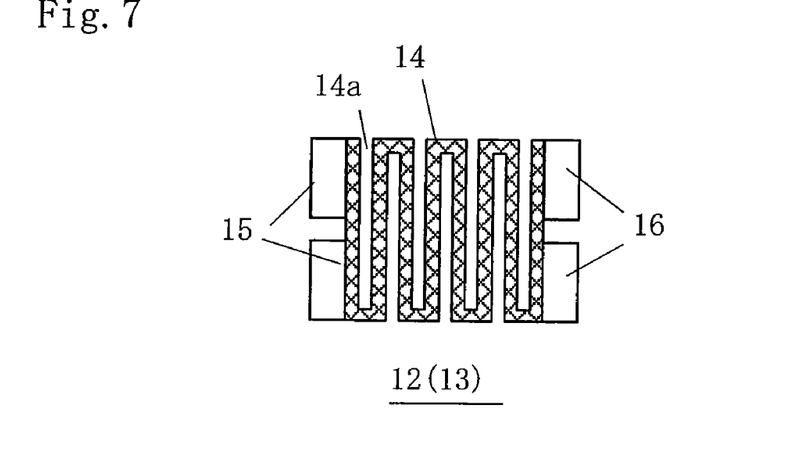
FIG. 7 is a view showing a second embodiment of the terahertz wave detecting apparatus according to the present invention.

FIG. 7 is a view showing a second embodiment of the terahertz wave detecting apparatus according to the present invention. Shown in FIG. 7 is the surface of the semiconductor chip 12 in FIG. 5.

As shown, the two-dimensional graphene 14 extends between the source electrode 15 and the drain electrode 16 in a zig-zag pattern with slits 14a alternately extending in the width direction, assuming such a structure that the width is narrow and the length is long as a whole to increase the electric resistivity between the source electrode 15 and the drain electrode 16. The other components are the same as those of the first embodiment shown in FIG. 5.

Figure 8A:
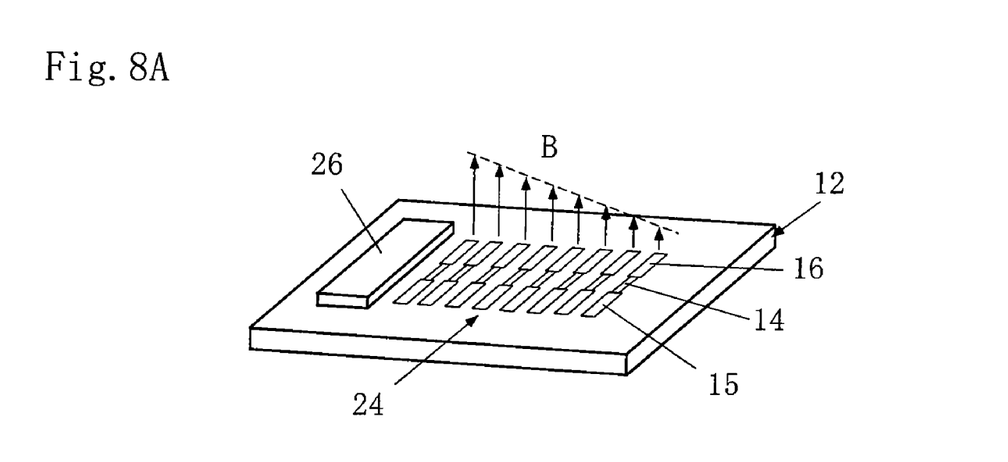
FIG. 8A and FIG. 8B are views showing a third embodiment of the terahertz wave detecting apparatus according to the present invention.
Figure 8B:
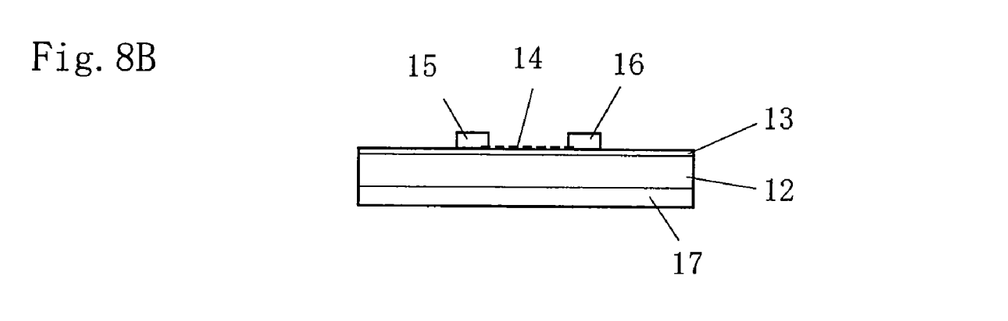

FIG. 8A and FIG. 8B are views showing a third embodiment of the terahertz wave detecting apparatus according to the present invention. FIG. 8A is a general perspective view, and FIG. 8B is a sectional view of graphene arrays 24 as part of FIG. 8A.

In this example, multiple (eight in this example) graphene arrays 24 are placed at intervals in parallel on the surface of the same semiconductor chip 12 (oxidized layer 13), forming one-dimensional arrays of graphene. Each graphene array 24 consists of the above-mentioned two-dimensional graphene 14, source electrode 15, and drain electrode 16.

A permanent magnet 26 is also placed outside the one-dimensional graphene arrays in parallel with each graphene array 24 to apply the magnetic field B to each graphene array 24. The strength of the magnetic field B applied to each graphene array 24 varies in distance from the permanent magnet 26.

The other components are the same as those of the first embodiment shown in FIG. 5.

According to this structure, steps (S2 and S6) of changing the magnetic field B in the terahertz wave detecting method of the present invention shown in FIG. 6 can be omitted.

According to the above-mentioned structure of the present invention, the photon energy hf of the terahertz light at the time of occurrence of cyclotron absorption equals Landau level energy spacing at the time of occurrence of cyclotron absorption. Since this energy spacing in the graphene is more than one order of magnitude of those in normal semiconductor materials, the frequency of the terahertz light can be measured accurately in a very wide frequency range, e.g., between about 1 to 50 THz.

Further, since the ability of graphene electrons to conduct current is more than 10 to 100 times that of normal semiconductor materials such as silicon at room temperature, the intensity of very weak terahertz light can be detected clearly in a small-scale apparatus structure without the need for ultralow temperatures. In addition, the frequency can be measured accurately in a very wide frequency range.

To sum up, the present invention has the following advantages:

(1) Wide-band detection is possible because of the symmetry between electrons and holes and the formation of wide Landau levels as expressed by Equation (2).

(2) Because the ability of electrons to conduct current is high, the need for ultralow temperatures is eliminated and very weak terahertz light can be detected.

First Embodiment

In a single layer of graphene, since the carriers are Dirac fermions, the formation of Landau levels due to the magnetic field is greatly different from that in normal semiconductor materials in that the level spacing spans a considerably wide band from far-infrared to mid-infrared (between about 1 to 50 THz). Therefore, the exploration of the unique Landau level structure and the application thereof to the implementation of frequency-tunable terahertz detectors can be expected. Thus, the electron transport properties of graphene under the interaction with terahertz waves have been examined.

Figure 9A:
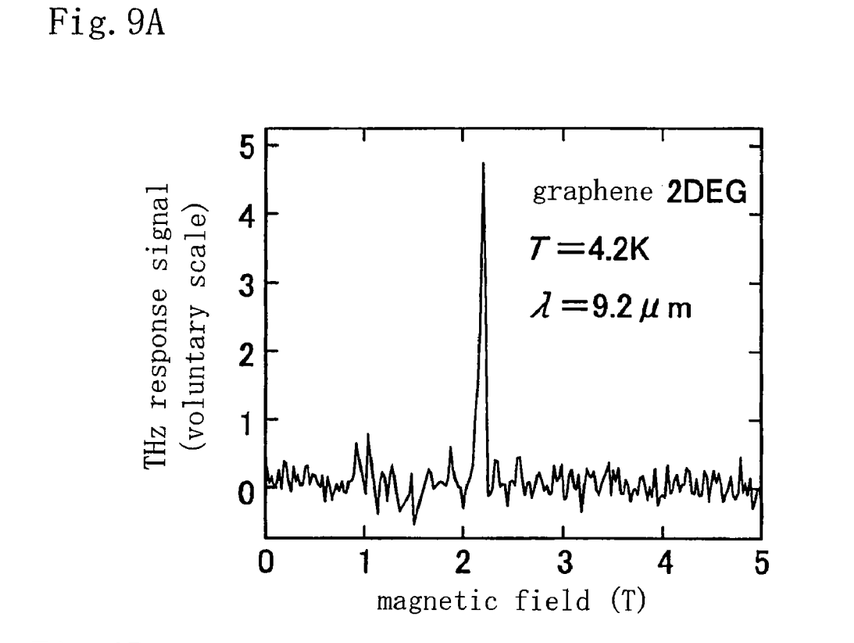
FIG. 9A and FIG. 9B are graphs showing first experimental results of the dependence of changes in electrical resistance on the magnetic field with respect to the irradiation of terahertz waves.
Figure 9B:
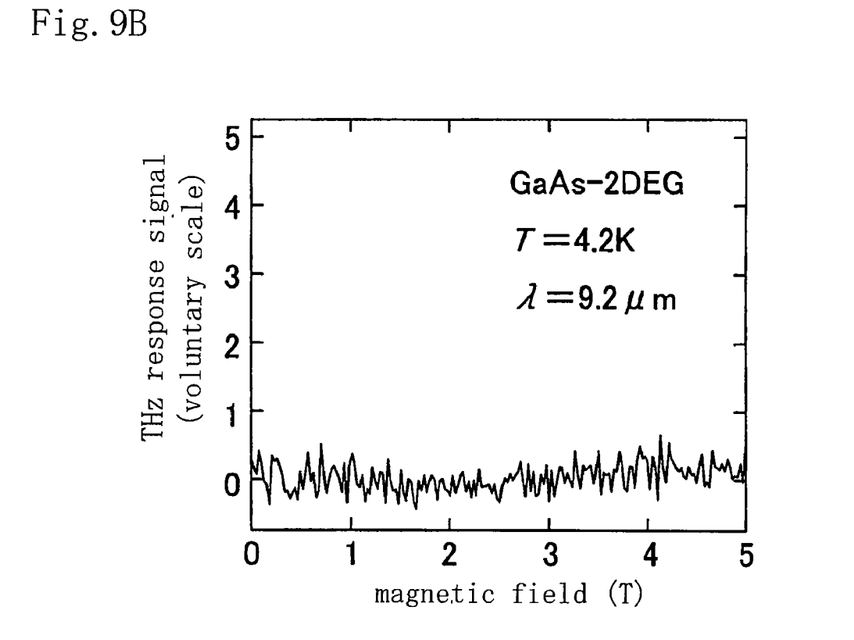

FIG. 9A and FIG. 9B are graphs showing first experimental results of the dependence of changes in electrical resistance on the magnetic field with respect to the irradiation of terahertz waves (at a temperature of 4.2K). FIG. 9A shows the result on graphene two-dimensional electron gas (2DEG), and FIG. 9B shows the result on normal GaAs/AlGaAs-2DEG. In this experiment, terahertz waves at a wavelength of 9.2 µm (where the photon energy is 134 meV and the frequency is 33 THz) was used to measure a difference in electric resistance between the presence and absence of irradiation of electromagnetic waves by means of a lock-in amplifier.

It is apparent from FIG. 9B that no response signal was observed in GaAs-2DEG. Adding the effective mass (0.067 $m_0$) of GaAs in the range of magnetic fields 0 to 5 T measured at that time, calculated inter-Landau-level energy spacing of the GaAs-2DEG are 0 to 8.5 meV. Since the photon energy (134 meV) of the irradiated terahertz waves is larger than the above-mentioned inter-Landau-level energy spacing, it can be said that the result that no electromagnetic waves were absorbed are reasonable.

In contrast, a clear peak appears at 2.2 T in the graphene 2DEG of FIG. 9A. The static magnetic field when electromagnetic waves of 134 meV is absorbed to cause a transition of the characteristic of Landau level n from −1 to 2 is 2.2 T. The static magnetic field 2.2 T observed in FIG. 9A well matches a static magnetic field at the time of occurrence of the above transition on the assumption that the carrier speed in the graphene 2DEG is about $1 \times 10^6$ m/s (from Non-Patent Documents 3 and 4).

Thus, it can be understood that the results of FIG. 9A and FIG. 9B show that Dirac fermions are excited to Landau levels of more than the Fermi energy through resonance absorption of terahertz waves.

Second Embodiment

Figure 10A:
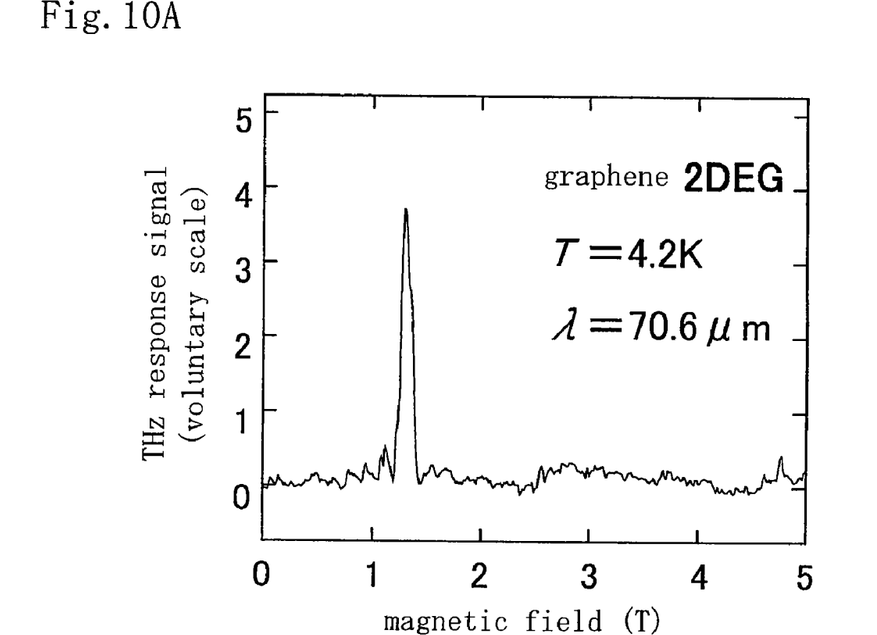
FIG. 10A and FIG. 10B are graphs showing second experimental results similar to the first embodiment.
Figure 10B:
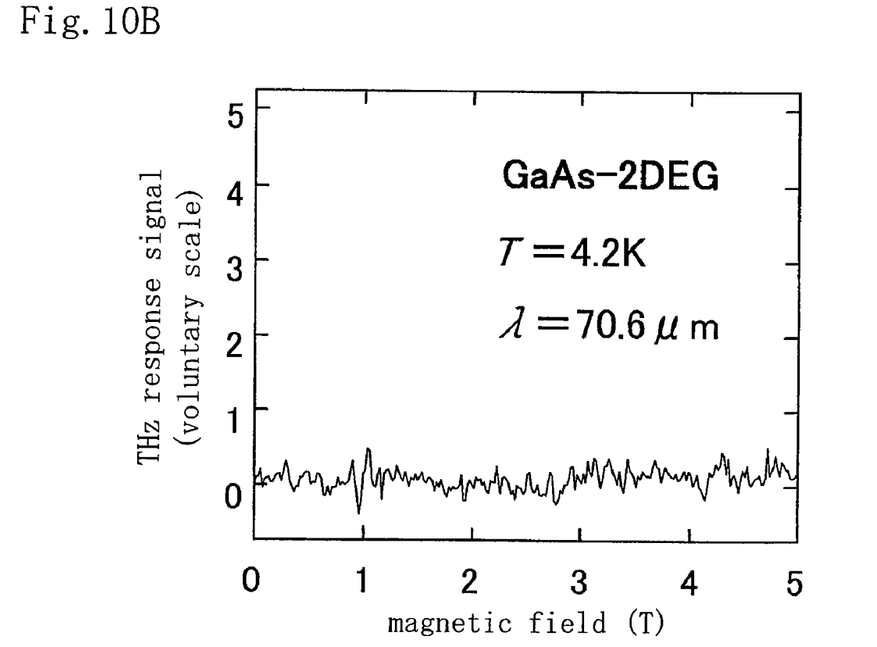

FIG. 10A and FIG. 10B are graphs showing second experimental results similar to those of the first embodiment. In this second embodiment, terahertz waves at a wavelength of 70.6 µm (where the photon energy is 17.6 meV and the frequency is 4.2 THz) were used.

It is apparent from FIG. 10B that any response signal (peak) indicative of absorption of electromagnetic waves was not observed in the GaAs-2DEG. If the effective mass of GaAs is assumed to be 0.067 $m_0$ like in the first embodiment, the inter-Landau-level energies of the GaAs-2DEG are 0 to 8.5 meV. Since the photon energy (17.6 meV) of the irradiated terahertz waves is larger than the inter-Landau-level energy spacing of the GaAs-2DEG, it can be said that the result that no peak indicative of absorption of electromagnetic waves was not observed is reasonable.

In contrast, in the graphene 2DEG of FIG. 10A, a clear peak appears at 1.29 T. The static magnetic field when electromagnetic waves of 17.6 meV are absorbed to cause a transition of the characteristic of Landau level n from 1 to 2 is 1.29 T. Like in the first embodiment, the result of FIG. 10A well matches the static magnetic field at the time of occurrence of the above-mentioned transition.

Thus, it can be understood that the results of FIG. 10A and FIG. 10B also show that Dirac fermions are excited to Landau levels of more than the Fermi energy through resonance absorption of terahertz waves.

Third Embodiment

Figure 11A:
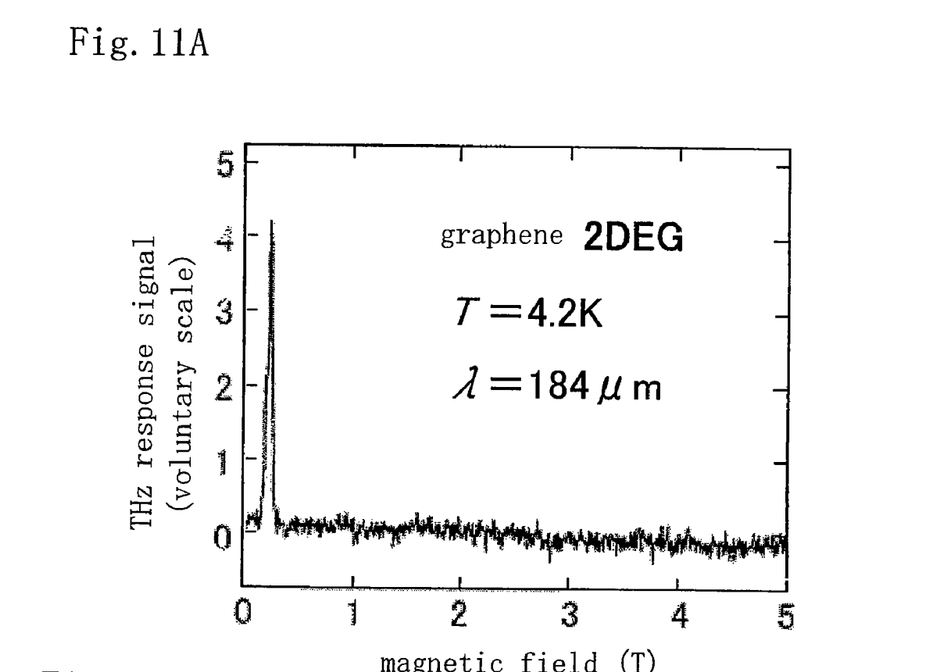
FIG. 11A and FIG. 11B are graphs showing third experimental results similar to the first embodiment.
Figure 11B:
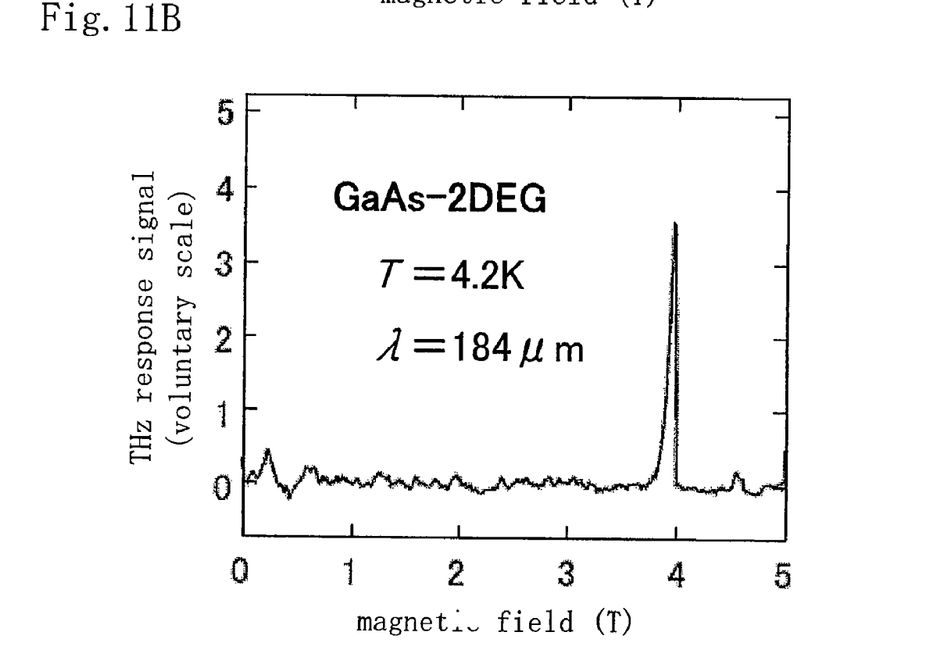

FIG. 11A and FIG. 11B are graphs showing third experimental results similar to those of the first embodiment. In this third embodiment, terahertz waves at a wavelength of 184 μm (where the photon energy is 6.7 meV and the frequency is 1.6 THz) were used.

It is apparent from FIG. 11B that a response signal (peak) indicative of absorption of electromagnetic waves in the GaAs-2DEG was observed in this example. If the effective mass of GaAs is assumed to be 0.067 $m_0$ like in the first embodiment, the inter-Landau-level energy spacing of the GaAs-2DEG are 0 to 8.5 meV. On the other hand, since the photon energy (6.7 meV) of the irradiated terahertz waves falls within the above-mentioned range of inter-Landau-level energies, it can be said that the result that the peak indicative of absorption of electromagnetic waves was observed is reasonable.

In contrast, in the graphene 2DEG of FIG. 11A, a peak appears at 0.19 T. The static magnetic field when electromagnetic waves of 6.7 meV are absorbed to cause a transition of the characteristic of Landau level n from 1 to 2 is 0.19 T. Like in the first embodiment, the result of FIG. 11A well matches the static magnetic field at the time of occurrence of the above-mentioned transition.

Thus, it can be understood that the results of FIG. 11A and FIG. 11B also show that Dirac fermions are excited to Landau levels of more than the Fermi energy through resonance absorption of terahertz waves.

From the above-mentioned results of the first to third embodiments, it was confirmed that according to the present invention the intensity of terahertz light could be clearly detected in the frequency range from 1.6 THz to 33 THz at a temperature of 4.2K higher than the conventional temperature range from 0.3 to 0.4K, and hence the frequency thereof could be measured accurately.

It is presumed that the present invention is also applicable to the detection of terahertz light in the frequency range from 1 to 50 THz beyond the limitation of the above-mentioned frequency range.

In addition, it is known from Non-Patent Document 5 that the Landau level structure expressed by Equation (2) and the high mobility of Dirac fermions as the basis of the detection of terahertz light according to the present invention hold true near normal temperatures (110K to 290K). Therefore, according to the present invention, the intensity and frequency of weak terahertz light can be measured accurately near normal temperatures above 4.2 K.

It should be noted that the present invention is not limited to the aforementioned embodiments, and various changes and modifications are of course possible without departing from the scope of the present invention.

What is claimed is:

1. A terahertz wave detecting apparatus comprising:
    a semiconductor chip with an oxidized layer formed on a surface thereof;
    a two-dimensional graphene, a conductive source electrode, and a drain electrode, all provided to adhere tightly to the surface of the semiconductor chip; and
    a gate electrode provided to adhere tightly to the reverse side of the semiconductor chip, wherein
    the two-dimensional graphene extends along the surface of the semiconductor chip, and both ends thereof are connected to the source electrode and the drain electrode, respectively, and
    the apparatus further comprises:
    a SD voltage detection circuit for passing a certain current between the source electrode and the drain electrode to detect a SD voltage therebetween;
    a gate voltage applying circuit for applying a variable gate voltage to the gate electrode, and
    a magnetic field generating device for applying a variable magnetic field to the two-dimensional graphene.

2. The terahertz wave detecting apparatus according to claim 1 further comprising a detection control device for controlling the SD voltage detection circuit, the gate voltage applying circuit, and the magnetic field generating device, and calculating a frequency and intensity of terahertz light from the SD voltage, the gate voltage, and a value of the magnetic field.

3. The terahertz wave detecting apparatus according to claim 2, wherein the detection control device measures a dependence of the SD voltage on the gate voltage and the magnetic field while irradiating terahertz light, detects a magnetic field value corresponding to the largest change in SD voltage with respect to the gate voltage and the magnetic field due to the irradiation of the terahertz light, and calculates the intensity and frequency of the terahertz light from this magnetic field value and the change in SD voltage.

4. A terahertz wave detecting method comprising:
    preparing a terahertz wave detecting apparatus including
        a semiconductor chip with an oxidized layer formed on a surface thereof,
        a two-dimensional graphene, a conductive source electrode, and a drain electrode, all provided to adhere tightly to the surface of the semiconductor chip, and
        a gate electrode provided to adhere tightly to the reverse side of the semiconductor chip, wherein
        the two-dimensional graphene extends along the surface of the semiconductor chip, and both ends thereof are connected to the source electrode and the drain electrode, respectively, and
        the apparatus further includes
        a SD voltage detection circuit for passing a certain current between the source electrode and the drain electrode to detect a SD voltage therebetween,
        a gate voltage applying circuit for applying a variable gate voltage to the gate electrode, and
        a magnetic field generating device for applying a variable magnetic field to the two-dimensional graphene,
    measuring a dependence of the SD voltage on the gate voltage and the magnetic field while irradiating terahertz light, detecting a magnetic field value corresponding to the largest change in SD voltage with respect to the gate voltage and the magnetic field due to the irradiation of the terahertz light, and calculating a frequency and intensity of the terahertz light from this magnetic field value and the change in SD voltage.

5. The terahertz wave detecting method according to claim 4, wherein the method is to:
    fix a source-drain current at a constant value in a state not to irradiate the terahertz light, change the magnetic field while varying the gate voltage so that a relative position of Fermi energies in Landau levels will become constant, measuring SD voltage V1, and calculate a dependence, V1=f1(B), of the SD voltage V1 on magnetic field B;

while irradiating a certain amount of terahertz light on condition that the source-drain current remains fixed, change the magnetic field while varying the gate voltage so that the relative position of the Fermi energies in the Landau levels will become constant, measure SD voltage V1', and calculate a dependence, V1'=f2(B), of the SD voltage V1' on the magnetic field B;

calculate a difference $\Delta V(B)$ between the SD voltage V1 and the SD voltage V1';

detect a peak in the difference $\Delta V(B)$, and determine the magnetic field B and a value of $\Delta V(B)$ at each peak; and detect an intensity of the terahertz light from the amount of change, $\Delta V(B)$, in SD voltage; and determine between which levels occurrence of an electronic transition corresponds to the magnetic field B at the detected peak to calculate a frequency of the terahertz light therefrom.

* * * * *